May 12, 1959 H. P. JACOBSON ET AL 2,886,707
INTERPOLATION DEVICE
Filed Oct. 1, 1956
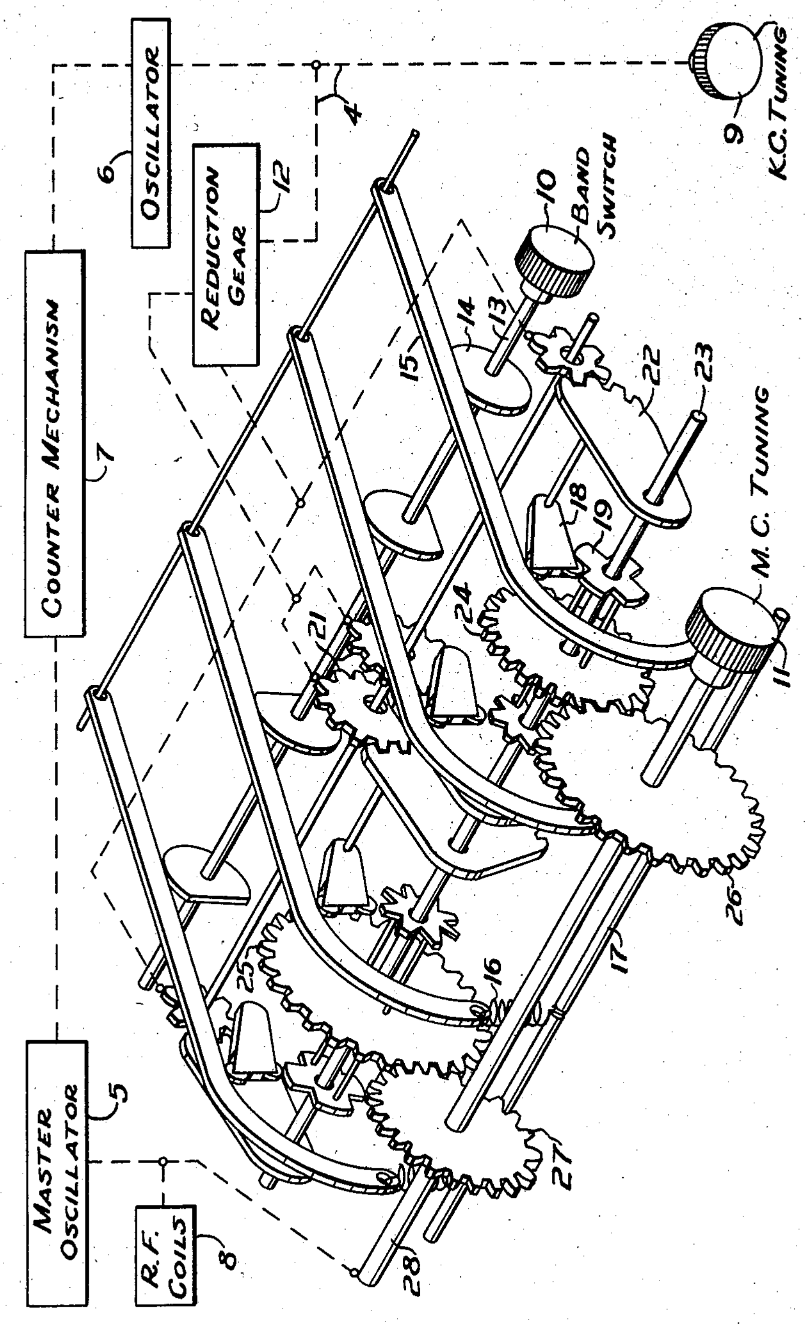
INVENTORS
HERBERT P. JACOBSON
WINSTON F. WILLIAMS
BY Moody and Harsha
ATTORNEYS 2,886,707
Patented May 12, 1959

2,886,707

INTERPOLATION DEVICE

Herbert P. Jacobson, Quito, Ecuador, and Winston F. Williams, Cedar Rapids, Iowa, assignors to Collins Radio Company, Cedar Rapids, Iowa, a corporation of Iowa Application October 1, 1956, Serial No. 613,348

2 Claims. (Cl. 250—36)

This invention relates to tuning mechanisms and more particularly to a tuning mechanism wherein a continuously variable tuning is accomplished over a wide range of frequencies.

There have been many prior tuning controls which position a tuning mechanism or a shaft to predetermined and fixed angular positions. Thus, predetermined and fixed frequencies may be selected by use of detent mechanisms in conjunction with selection or tuning mechanisms. This invention is not to be confused with these pre-set fixed frequency tuning devices. This invention provides for continuous and accurate tuning between preset band or frequency-limiting positions. This invention is featured by a coarse tuning and a fine tuning where the fine tuning is interpolated with and adjusts the coarse tuning, but where the coarse tuning mechanism has no effect upon the fine tuning mechanism.

It is an object of this invention to provide a tuning control which is continuously variable over an extremely wide range of frequencies. It is a further object of this invention to provide a tuning mechanism which will easily adjust to large changes in frequency or to small changes in frequency. It is still another object of this invention to provide a tuning mechanism closely allied with a counting mechanism for visually displaying the numerical value of the frequency tuned. It is a still further object of this invention to provide a tuning mechanism in conjunction with an interpolation mechanism whereby a plurality of selectable bands of frequencies may be controlled by a coarse and a fine tuning control to select accurately any frequency within the band range.

These and other objects of this invention will become apparent when the following description is read in conjunction with the single drawing of this invention, which consists of a pictorial representation of one embodiment of this invention. The operation of this invention may be best understood if the radio portion or frequency-sensitive mechanisms with which the mechanical interpolation portion of this invention is associated is first briefly described. Thus, the master oscillator 5 is a stabilized master oscillator having a stabilized frequency output at a plurality of frequencies. The interpolation oscillator 6 is used to vary the frequency output continuously and smoothly, utilizing the mechanical interpolator between the stabilized output points of the stabilized master oscillator 5. There is a gear connection between the stabilized master oscillator 5, the oscillator 6, and the counter mechanism 7. The counter mechanism is not shown here in detail but it is desirable that it be so constructed that it will pictorially display at all times the frequency tuned by the master oscillator and the interpolation oscillator. Such a counter mechanism is fully described and claimed in our co-pending application "Counter Mechanism," Serial No. 613,788, filed October 3, 1956. The radio frequency coils 8 are so inter-related with the master oscillator 5 that the desired stabilized frequency outputs are obtained at predetermined frequency values. There are three knobs incorporated in this invention, 9, 10, and 11. These knobs are, respectively, the kilocycle or fine tuning knob, the bandswitch, and the megacycle or coarse tuning knob. The kilocycle tuning knob 9 is connected through gear train 4 to the reduction gear 12 and the oscillator 6. The bandswitch tuning knob 10 is connected to a shaft 13 having a plurality of four cams 14 attached thereto. These cams 14 each have a flat face with the face on each cam being at a 90-degree angle with respect to the face of the adjacent cams. These cams 14 individually lift the pawls 15 associated therewith. These four pawls 15 are fastened by springs 16 to a fixed shaft 17 in such a manner that the selected cam 14 has its flat face positioned against the pawl 15; with the spring tension actuating the associated pawl downward, the associated detent follower 18 is thereby forced into position in one detent notch of detent wheel 19. The turning of the knob 9 now applies a force to the input side of the reduction gear 12. The output from the reduction gear 12 consists of two mechanical movements, each movement having a different rate. It is noted that both of these rates are also different from the rate of turn of the kilocycle tuning knob 9. The mechanical motion transmitted from the reduction gear 12 is applied to the gear teeth 21. The gear teeth 21 then cause rotation of the sector gear 22. A predetermined one of sector gears 22 then rotates the detent mechanisms 18 and 19 and gears 24 and 25. Gear 24 has a one-to-one ratio with gear 26, while gear 25 has a two-to-one ratio with gear 27. Gear 27 and gear 26 are firmly affixed to shaft 28 and rotate the shaft 28 in response to the force applied to either gear 26 or gear 27. The shaft 28 is mechanically connected to the radio frequency coils 8 and the stabilized master oscillator 5. Thus, as the shaft 28 is rotated, the output frequency of the stabilized master oscillator 5 is changed.

The detent mechanisms 18 and 19 have a ratio of 2, 4, 8, and 16 for each detent, respectively. Thus, depending upon the bandswitch position, there will be a rotation of shaft 28 of two revolutions, four revolutions, eight revolutions, or sixteen revolutions for each detent. Thus, the master oscillator is varied in a predetermined manner as the interpolation oscillator is varied. There is always maintained a desired relationship between the oscillators or any other control devices by this interpolation device.

From the above description, it is obvious that there is no mechanical feedback through this tuning device to the kilocycle tuning knob 9 when the megacycle tuning knob 11 is rotated. This lack of feedback is due to the inherent friction causing energy losses in the gears and the step-up ratio in the reduction gear 12.

Two of the sector gears 22 rotate through an arc of 22½ degrees and two of the gears rotate through an arc of 90 degrees. Thus it is seen that for a desired number of revolutions of knob 9, shaft 28 may be rotated 22½ degrees, 45 degrees, 90 degrees, or 180 degrees. Thus, dependent upon the position of the bandswitch selector 10, the shaft 28 may be rotated through a predetermined arc which will vary the frequency of the master oscillator a predetermined amount. It is possible with this invention to rotate the coarse tuning knob so as to obtain a coarse tune of the oscillation equipment without affecting the fine tuning of this equipment resulting from the rotation of the kilocycle knob 9.

As is obvious from the diagram, each tuning section is detent-controlled. Two of the detent wheels have four detents and two of the wheels have sixteen detents. However, for purposes of representation, the sixteen-detent wheels have been depicted as having only eight detents. Proper operation of this invention is dependent upon the two detent wheels having sixteen detents. The detent control includes the overriding operation of the megacycle tuning knob 11, permitting the overriding of the detent mechanisms 18 and 19 within any particular band selection.

Although this invention has been described with respect to a particular embodiment thereof, it is not to be so limited as changes and modifications may be made therein which are within the full intended scope of the invention, as defined by the appended claims.

What is claimed is:

1. A tuning system including a first variable oscillator, a second variable oscillator, a first shaft connected to said first oscillator for varying its output frequency as said first shaft is rotated, a second shaft connected to said second oscillator for varying its output frequency as said second shaft is rotated, unilateral motion-transmitting means connecting said shafts including a reduction gear connected to said second oscillator shaft, a gear ratio selection means including a plurality of cams and pawls, a plurality of gear ratios including driving gears, a plurality of sector gears having various-sized sectors and a plurality of driven gears of different sizes on said first shaft, said selected one of said gear ratios connecting said reduction gear to said driving gears, said driving gears rotating said driven gears through said sector gears whereby the rotation of said second shaft produces a predetermined rotation of said first shaft with resultant controlled change in output frequency.

2. An interpolation system for providing a plurality of ratios between the rotation of two shafts including a reduction gear, a pair of shafts, a first one of said shafts connected to said reduction gear, the other side of said reduction gear being connected to a plurality of driving gears, a plurality of sector gears driven by said driving gears, said sector gears being of various arcuate sizes, a plurality of detent mechanisms, a selection mechanism including a shaft having a plurality of cams thereon, said cams controlling said detent mechanisms and permitting a selected detent mechanism to engage, said detent mechanism being connected to said sector gears whereby, as said sector gears rotate, said selected detent mechanism rotates one of a plurality of various-sized gears, said rotating one of said last-mentioned gears driving one of a plurality of various-sized gears on the second one of said shafts so that as said first shaft is rotated, said second shaft is rotated an amount corresponding to a selected ratio between said first rotation and said second rotation.

References Cited in the file of this patent

UNITED STATES PATENTS

| | | |
|---|---|---|
| 1,606,929 | Fernandes | Nov. 16, 1926 |
| 1,853,039 | Churchward | Apr. 12, 1932 |
| 2,262,149 | Slonczewski | Nov .11, 1941 |
| 2,505,572 | Oueracker | Apr. 25, 1950 |
| 2,808,506 | Skwarek | Oct. 1, 1957 |